(12) United States Patent
Burks et al.

(10) Patent No.: US 6,185,723 B1
(45) Date of Patent: *Feb. 6, 2001

(54) METHOD FOR PERFORMING TIMING ANALYSIS OF A CLOCK-SHAPING CIRCUIT

(75) Inventors: Timothy Michael Burks; Robert Edward Mains, both of Austin, TX (US)

(73) Assignee: International Business Machines Corporation, Armonk, NY (US)

( * ) Notice: Under 35 U.S.C. 154(b), the term of this patent shall be extended for 0 days.

This patent is subject to a terminal disclaimer.

(21) Appl. No.: 08/757,977

(22) Filed: Nov. 27, 1996

(51) Int. Cl.[7] ............................................. G06F 17/50

(52) U.S. Cl. ........................... 716/6; 716/5; 703/19; 703/14; 703/15; 703/16

(58) Field of Search .................................. 364/488, 489, 364/490, 491; 395/555, 500.4, 500.07, 500.34, 500.35, 500.36, 500.06, 500.37; 371/61

(56) References Cited

U.S. PATENT DOCUMENTS

| | | | |
|---|---|---|---|
| 4,542,509 | * 9/1985 | Buchanan et al. | 371/61 |
| 4,827,428 | 5/1989 | Dunlop et al. | 364/491 |
| 4,924,430 | 5/1990 | Zasio et al. | 364/578 |
| 5,051,606 | * 9/1991 | Ikehara | 307/134 |
| 5,095,454 | 3/1992 | Huang | 364/578 |
| 5,191,541 | 3/1993 | Landman et al. | 364/489 |
| 5,210,700 | * 5/1993 | Tom | 364/489 |
| 5,222,030 | 6/1993 | Dangelo et al. | 364/489 |
| 5,323,401 | 6/1994 | Maston | 371/27.1 |
| 5,365,463 | 11/1994 | Donath et al. | 364/578 |
| 5,444,407 | * 8/1995 | Ganapathy et al. | 327/395 |
| 5,475,605 | 12/1995 | Lin | 364/488 |
| 5,475,607 | 12/1995 | Apte et al. | 364/489 |
| 5,493,508 | 2/1996 | Dangelo et al. | 364/489 |
| 5,508,937 | 4/1996 | Abato et al. | 364/488 |
| 5,561,792 | * 10/1996 | Ganapathy | 395/550 |
| 5,636,372 | * 6/1997 | Hathaway et al. | 395/555 |
| 5,686,845 | * 11/1997 | Erdal et al. | 326/93 |
| 5,705,942 | * 1/1998 | Ashuri | 326/93 |
| 5,740,347 | * 4/1998 | Avidan | 395/183.09 |
| 5,771,375 | * 6/1998 | Mains | 395/558 |
| 5,798,938 | * 8/1998 | Heikes et al. | 364/490 |

OTHER PUBLICATIONS

Hitchcock, Sr., R. B., et al., "Timing Analysis of Computer Hardware," *IBM J. Res. Develop.*, vol. 26, No. 1, Jan., 1982, pp. 100–105.

Jouppi, N. P., "Timing Analysis and Performance Improvement of MOS VLSI Designs," *IEEE Transactions on Computer–Aided Design*, vol. CAD–6, No. 4, Jul., 1987, pp. 650–665.

Ousterhout, J. K., "Crystal: A Timing Analyzer for nMOS VLSI Circuits," *Proc. 3rd Cal. Tech. VLSI Conf.*, Computer Science Press, 1983, pp. 57–69.

Pillage, L. T., et al., "Asymptotic Waveform Evaluation for Timing Analysis," *IEEE Transactions on CAD*, Apr., 1990, pp. 352–366.

(List continued on next page.)

*Primary Examiner*—Paul R. Lintz
*Assistant Examiner*—Vuthe Siek
(74) *Attorney, Agent, or Firm*—Winstead Sechrest & Minick P.C.; Anthony V. S. England (57) ABSTRACT

A methodology is implemented for accurately and precisely computing the output signal times for clock circuit in a data processing system (600) using transistor-level static timing analysis tools which compute delays of blocks or subcircuits that correspond to channel-connected components of transistors. During execution of the Static timing analysis, the predictability of clock signals is recognized and denoted in a timing model (616–622). Furthermore, an actual logical function of the clock circuit is determined during execution of the static timing analysis to provide more precise knowledge of the rise and fall times of the signals provided to the clock circuit.

27 Claims, 6 Drawing Sheets

OTHER PUBLICATIONS

Ratzlaff, C. L., et al., "Rice: Rapid Interconnect Circuit Evaluator," 28th ACM/IEEE Design Automation Conference, Paper 33.1, 1991, pp. 555–560.

Ratzlaff, C. L., et al., *Rice Toolkit Reference Manual*, Version 4.0, Computer Engineering Research Center, The University of Texas at Austin, Austin, Texas, Sep., 1992.

U.S. Patent application Ser. No. 08/757,976, entitled "Method for Performing Timing Analysis of a Clock Circuit" (Attorney Docket No. AT9–96–113), pending.

* cited by examiner

METHOD FOR PERFORMING TIMING ANALYSIS OF A CLOCK-SHAPING CIRCUIT

CROSS-REFERENCE TO RELATED APPLICATION

Related subject matter may be found in the following commonly assigned, co-pending U.S. patent application:

Ser. No. 08/757,976 entitled "METHOD FOR PERFORMING TIMING ANALYSIS OF A CLOCK CIRCUIT", which is filed of even date herewith.

TECHNICAL FIELD

This invention relates to a method for static timing analysis of integrated circuits, and more particularly, to a method for determining the timing of an output signal of a clock-shaping circuit.

BACKGROUND INFORMATION

A wide variety of design verification tools are required to produce a working integrated circuit from a functional specification. These tools analyze different parameters of a circuit design to insure that the circuit will function properly after it is fabricated. One important set of verification tools includes timing analysis tools which are widely used to predict the performance of very large scale integrated (VLSI) designs. Such timing analysis tools may be either static or dynamic. Dynamic timing analysis tools provide the most detailed and accurate information obtainable concerning the performance of a circuit. This type of timing analysis is often generated through simulation of a circuit model by simulation programs which operate at the transistor level. Examples of such circuit simulation programs are SPICE by University of California at Berkeley and ASTAP by IBM Corporation. These dynamic timing analysis programs typically operate by solving matrix equations relating to the circuit parameters such as voltages, currents, and resistances. Additionally, such circuit simulation approaches to performance analysis are pattern dependent, or stated another way, the possible paths and the delays associated therewith depend upon a state of a controlling mechanism or machine of the circuit being simulated. Thus, the result of a dynamic timing analysis depends on the particular test pattern, or vector, applied to the circuit.

While such circuit simulation programs and dynamic timing analysis tools provide high accuracy, long simulation times are required because a large number of patterns must be simulated because the best and worst case patterns are not known before the simulation occurs. In fact, a number of simulations which must be performed is proportional to $2^n$, where "n" is a number of inputs to the circuit being simulated. Thus, for circuits having a large number of inputs, dynamic timing analysis is not always practical.

Static timing analysis tools are also widely used to predict the performance of VISL designs. Static timing analyzers are often used on very large designs for which exhaustive dynamic timing analysis is impossible or impractical due to the number of patterns required to perform the analysis. In static timing analysis, it is assumed that each signal being analyzed switches independently in each cycle of the state machine controlling that circuit. Furthermore, in static timing analysis, only the best and worst possible rising and falling times are computed for each signal in the circuit. The best and worst possible rising and falling times are typically determined in a single pass through a topologically sorted circuit. When referring to a topologically sorted circuit, it should be noted that a signal time associated with each point in the circuit being tested is determined in a sequential nature. Therefore, the signal time associated with the input of a first subcircuit whose output will be propagated to the input of a second subcircuit must be determined before the signal time associated with the input of the second subcircuit is calculated. Typical static analysis methods are described in "Timing Analysis of Computer Hardware," by Robert B. Hitchcock, Sr., et al., *IBM J Res. Develop.*, Vol. 26, No. 1, pp. 100–105 (1982), which is incorporated by reference herein.

Figure 1:
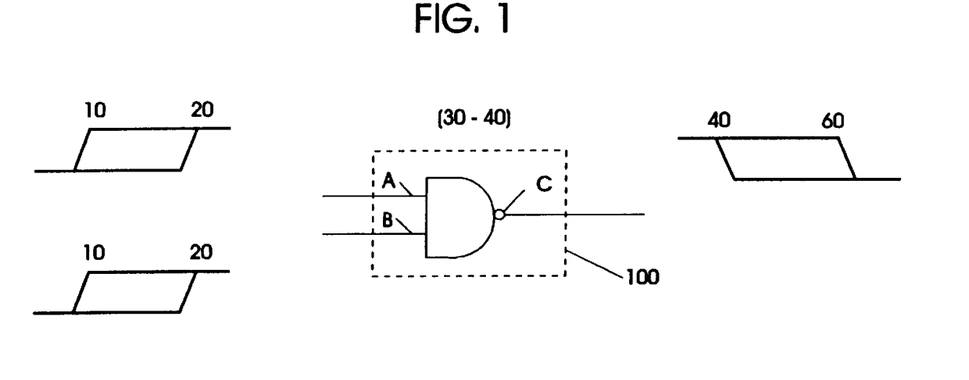
FIG. 1 is a logic diagram of a device which may be analyzed using conventional static timing analysis techniques.

Static timing analysis may be applied to a simple two input NAND circuit 100 such as that illustrated in FIG. 1. Typically, cells such as the one shown in FIG. 1 are kept in cell libraries and may be used as building blocks by designers to construct larger and more complex integrated circuits. Typically, for each cell in a cell library, a dynamic timing analysis has already been performed and the timing parameters of the cell are maintained as part of the cell description. In the example shown, NAND circuit 100 is known to have a minimum delay of 30 picoseconds, and a maximum delay of 40 picoseconds, for a rising edge received at an inputs A and B. Thus, if it is known that a rising edge will be received at input A at sometime between 10 and 20 picoseconds measured from an initial time p0, then the earliest output will be a falling edge at output C at 40 picoseconds and a latest falling edge at output C at 60 picoseconds from time, p0. Since in any given cycle a data signal on input B can be either high or low, input B is ignored when computing the delay from input A to the output C. Thus, the timing computed for the circuit is described in terms of minimum and maximum signal switching times and is independent of the actual pattern received at the inputs.

Transistor-level timing analyzers eliminate the need for predefined cell libraries by decomposing circuits into channel-connected components and automatically computing the delay of each component. Such channel connected components are non-intersecting groups of transistors which are connected by source and drain terminals to one another and to supply and ground nets, or connections. Each channel connect component can be analyzed independently to compute the worst case delays from each input to each output for both rising and falling signals. Details of such delay calculation techniques are well-known to those with skill in the art. For more information, refer to "Timing Analysis and Performance Improvement of MOS VLSI Designs," by Jouppi, *IEEE Transactions on Computer-Aided Design*, Vol. 6, No. 4 (1987), and "Crystal: A Timing Analyzer for NMOS VLSI Circuits," by Ousterhout, Proc. 3rd Cal. Tech. VLSI Conf., Computer Science Press, pp. 57–69 (1983), each of which is incorporated herein by reference.

Figure 2:
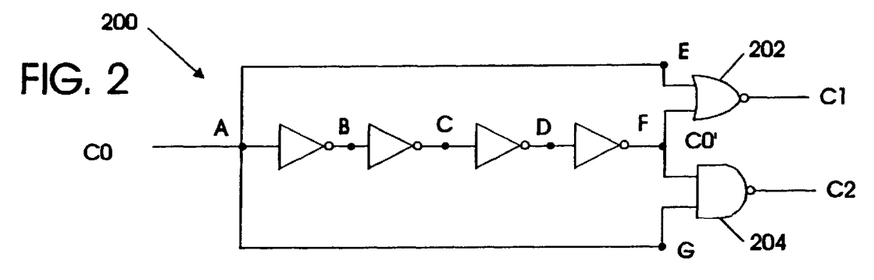
FIG. 2 illustrates, in block diagram form, one embodiment of a clock-shaping circuit such as that analyzed in accordance with the method of the present invention.
Figure 3:
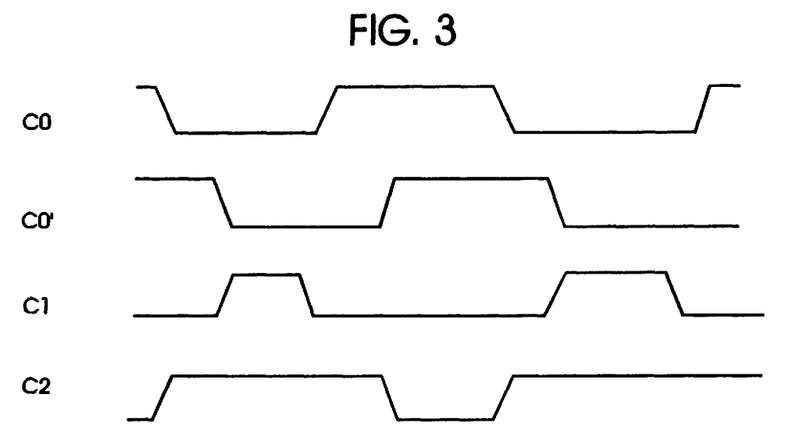
FIG. 3 illustrates, in timing diagram form, the timing relationship between the inputs and outputs of the clock shaping circuit of FIG. 2.

Although the traditional transistor level static timing analysis approach works well for many logic circuits, this approach typically overly constrains the timing associated with clock-shaping circuits. Clock-shaping circuits are common in memory arrays such as caches where precise signal timing is required. Specifically, clock-shaping circuits are provided to widen or narrow a clock pulse. A typical clock-shaping circuit is illustrated in FIG. 2. The timing associated with the clock-shaping circuit is illustrated in FIG. 3. As is illustrated in FIG. 3, the signal C0' is a delayed version of an input clock signal, C0. When the C0' signal is combined with the C0 signal at a NOR gate 202, a C1 output signal is produced. Similarly, when the C0' signal is combined with the C0 signal at NAND gate 204, the C2 signal is generated. As illustrated in FIG. 3, the C1 signal output from NOR gate 202 produces a narrowed pulse and the C2 signal output by NAND gate 204 produces a widened pulse.

Figure 4:
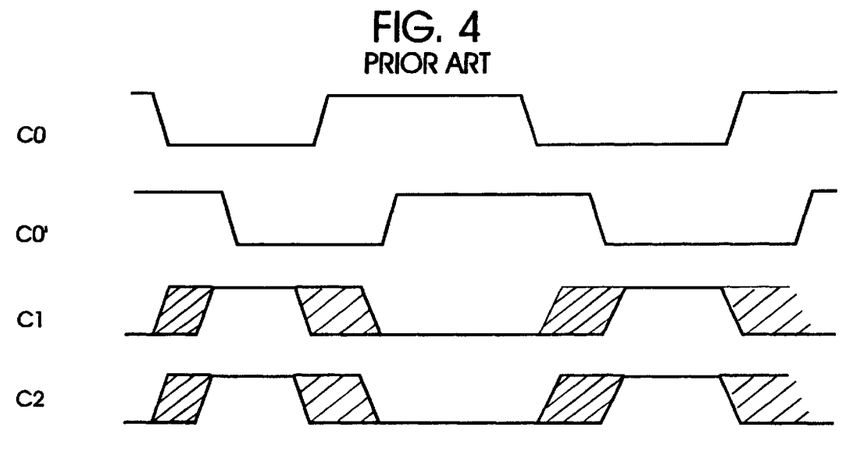
FIG. 4 illustrates, in timing diagram, a timing relationship identified by prior art transistor level static timing analysis.

When the prior art (static timing analysis) methodologies are implemented to determine the timing associated with the clock-shaping circuit, the signal event times illustrated in FIG. 4 are computed. In the timing diagram of FIG. 4, the hashed areas represent regions of uncertainty between the maximum and minimum possible signal event times. In FIG. 4, the functions of NOR gate 202 and NAND gate 204 are essentially ignored because the signal timing is computed in a pattern-independent way. This pattern independence is necessary when the gate inputs are data signals that can have arbitrary combinations of values. However, when the inputs are clock signals, they can be expected to switch in predictable ways and the worst-case times computed using a pattern-independent analysis can be unnecessarily pessimistic. These clock signals are usually used to synchronize signal flow through data paths in a digital circuit. If the clock signals are reshaped, it is to adjust their timing to allow some path or paths to meet timing constraints that would be violated with the original clock signal. The excess pessimism of the pattern-independent analysis of the reshaped clock will thus cause a large number of data paths to falsely appear to fail.

As a result, there is a need in the art for a pattern independent method for analyzing the timing associated with a clock shaping circuit in an accurate and efficient manner.

SUMMARY OF THE INVENTION

The previously mentioned needs are fulfilled with the present invention. Accordingly, there is provided, in a first form, a method for performing a timing analysis of a clock circuit. The method includes the step of receiving a plurality of input signals at a node of the clock circuit. A phase corresponding to a first one of the plurality of input signals of the node is then determined. A simulation pattern which enables an output of the node to transition from a first logic state to a second logic state by applying a generated signal which has the phase corresponding to the first one of the plurality of input signals of the node is then generated.

Additionally, there is provided, in a second form, a method for performing static timing analysis of a circuit. The method generates a timer model load which indicates a model of the circuit and generates a phase table using the timer model load. A plurality of arrival time assertions are generated using the phase table and the timer model load and the plurality of arrival time assertions indicates a plurality actual signal event times and a plurality of phases associated with an event. The plurality of phases are propagated through the model of the circuit to identify each of a plurality of nodes of the circuit as one of a clock node and a data node. A delay and an arrival time are computed for each of the plurality of nodes in the circuit. The computation involves the steps of receiving a plurality of input signals of a first one of the plurality of nodes, determining a phase corresponding to a first one of the plurality of input signals of the first one of the plurality of nodes, and generating a simulation pattern which enables an output of the first one of the plurality of nodes to transition from a first logic state to a second logic state by applying a generated signal which has the phase corresponding to the first one of the plurality of input signals of the first one of the plurality of nodes.

Furthermore, there is provided, in a third form, a data processing system which includes a memory for storing a model of a clock circuit. The data processing system also includes a static timing analysis tool for computing a delay between a first signal being provided to a node of the clock circuit and a second signal being output by the node of the clock circuit in response to the first signal. The static timing analysis tool computes the delay by determining a phase corresponding to the first signal and applying a generated signal which has the phase corresponding to the first signal to the node.

These and other features, and advantages, will be more clearly understood from the following detailed description taken in conjunction with the accompanying drawings. It is important to note the drawings are not intended to represent the only form of the invention.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

The present invention implements a methodology for accurately and precisely computing the output signal times for a clock-shaping circuit in a clocked digital circuit of a data processing system. Specifically, the methodology of the present invention may be implemented in transistor-level static timing analysis tools which compute delays of blocks or subcircuits that correspond to channel-connected components of transistors. In the present invention, the static timing analysis techniques traditionally implemented are modified to more accurately compute signal times at the outputs of a clock-shaping circuit. The operation and implementation of the present invention will subsequently be described in greater detail.

During a following description of the implementation of the invention, the terms "assert" and "negate" and various grammatical forms thereof, are used to avoid confusion when dealing with a mixture of "active high" and "active low" logic signals. "Assert" is used to refer to the rendering of a logic signal or register bit into its active, or logically true state. "Negate" is used to refer to the rendering of a logic signal or register bit into its inactive or logically false state.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, some of the details concerning timing considerations and the like have been omitted inasmuch as those details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 5:
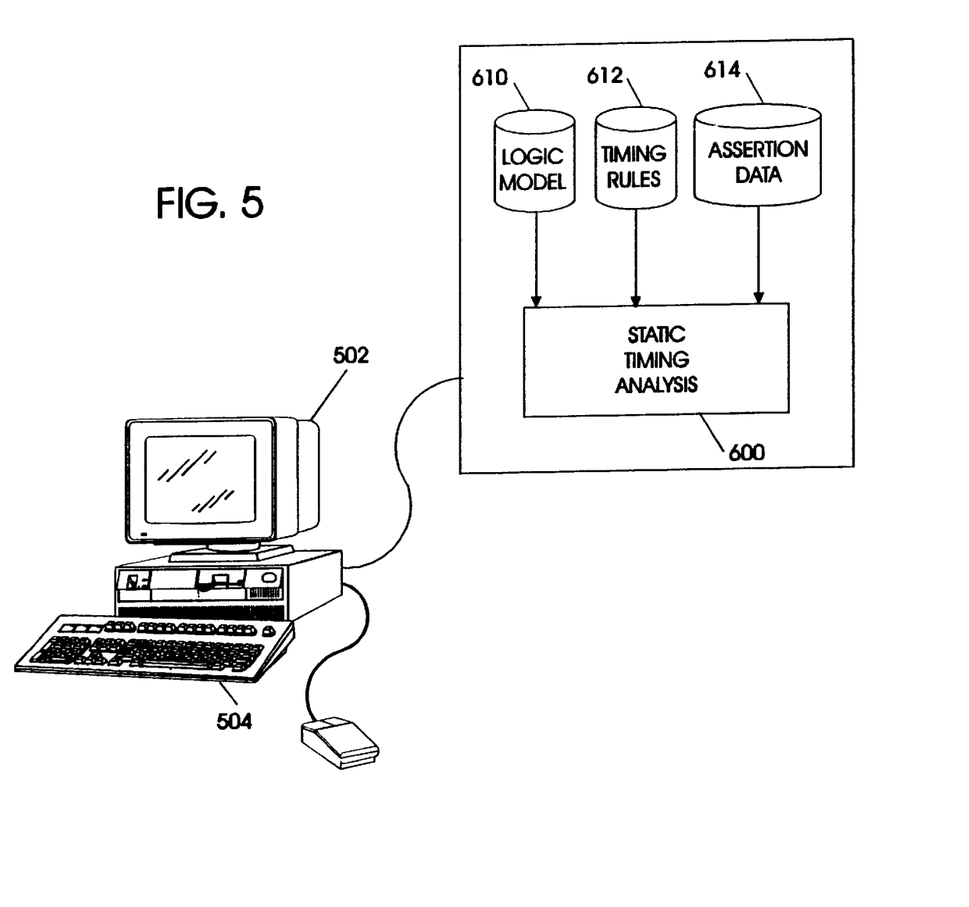
FIG. 5 illustrates, in block diagram form, a data processing system which implements one embodiment of the present invention.

FIG. 5 is a block diagram illustrating a data processing system in which the present invention may be used. The data processing system of FIG. 5 comprises a terminal 502, an input device 504, and a data processing system 600. When utilizing the present invention, a circuit design engineer may access the static timing analysis program stored in data processing system 600 using both terminal 502 and input device 504. Use of terminal 502 and input device 504 to access a static timing analysis is well-known to those skilled in the data processing art and will not be described in greater detail herein.

Figure 6:
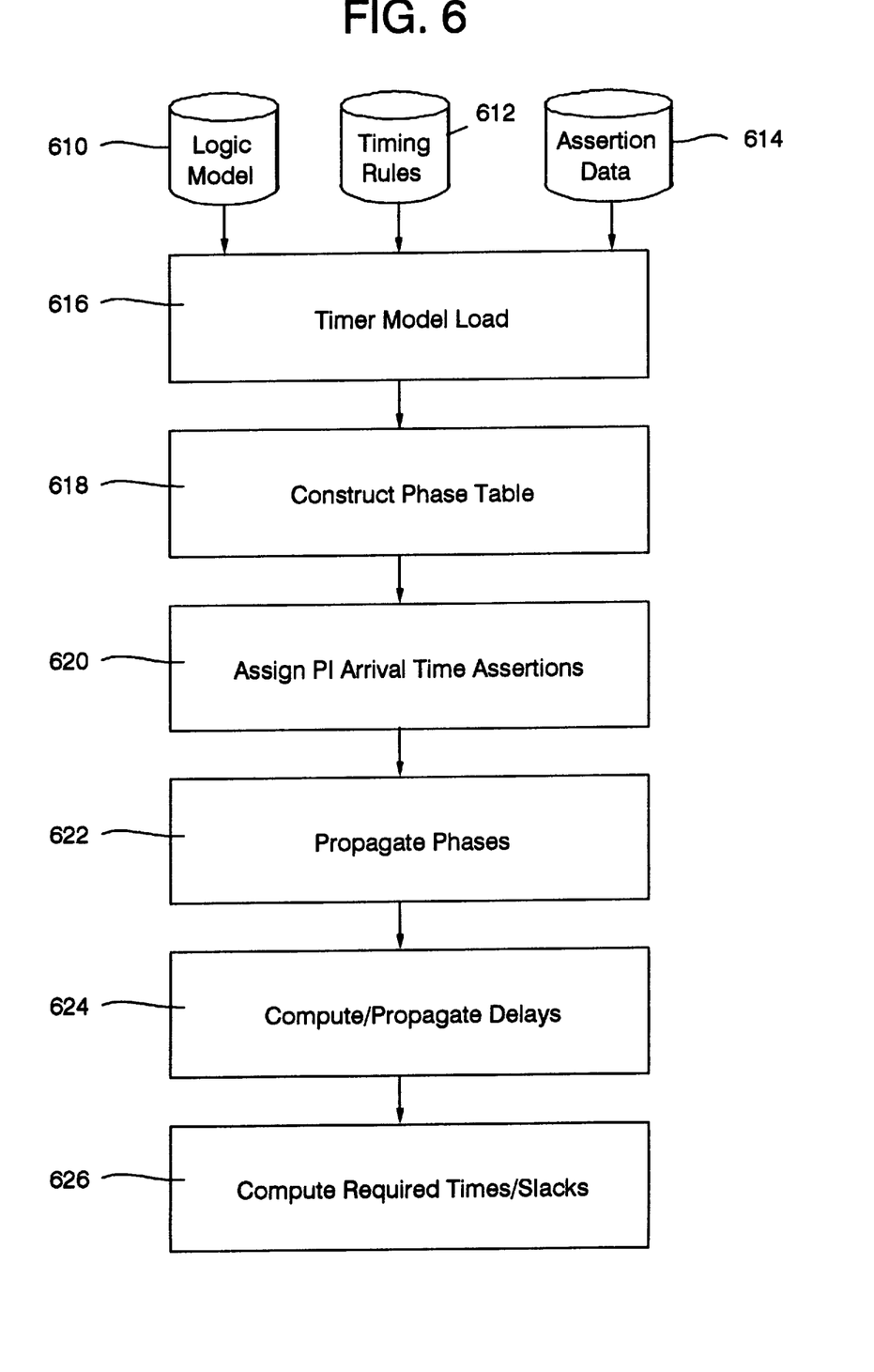
FIG. 6 illustrates, in flow diagram form, a method for performing a static timing analysis of a circuit in accordance with one embodiment of the present invention.

FIG. 6 is a block diagram illustrating the steps implemented in the performance of an improved static timing analysis method according to the present invention. Initially, a logic model 610 and assertion data 614, which comprise primary input (PI) arrival times, primary output (PO) required times, and clock phase definitions for all clocks are combined to establish a timer model load in block 616. The timer model load 616 constructs a graph-like representation of a circuit being tested using inputs from logic model 610 and assertion data 614. With phase information from assertion data 614, data processing system 600 constructs a phase table in block 618, which is consistent with the table illustrated in Table 1.

TABLE 1

| Tag | Type | Base Time | Period | Comment |
|---|---|---|---|---|
| L1+ | clock | 2000 ps | 4000 ps | rising edge of L1 clock |
| L1− | clock | 4000 ps | 4000 ps | failing edge of L1 clock |
| L1R | data | 2000 ps | 4000 ps | data triggered by L1 clock rise |
| L1F | data | 4000 ps | 4000 ps | data triggered by L1 clock fall |
| L2+ | clock | 0 ps | 4000 ps | rising edge of L2 clock |
| L2− | clock | 2000 ps | 4000 ps | failing edge of L2 clock |
| L2R | data | 0 ps | 4000 ps | data triggered by L2 clock rise |
| L2F | data | 2000 ps | 4000 ps | data triggered by L2 clock fall |

Figure 8:
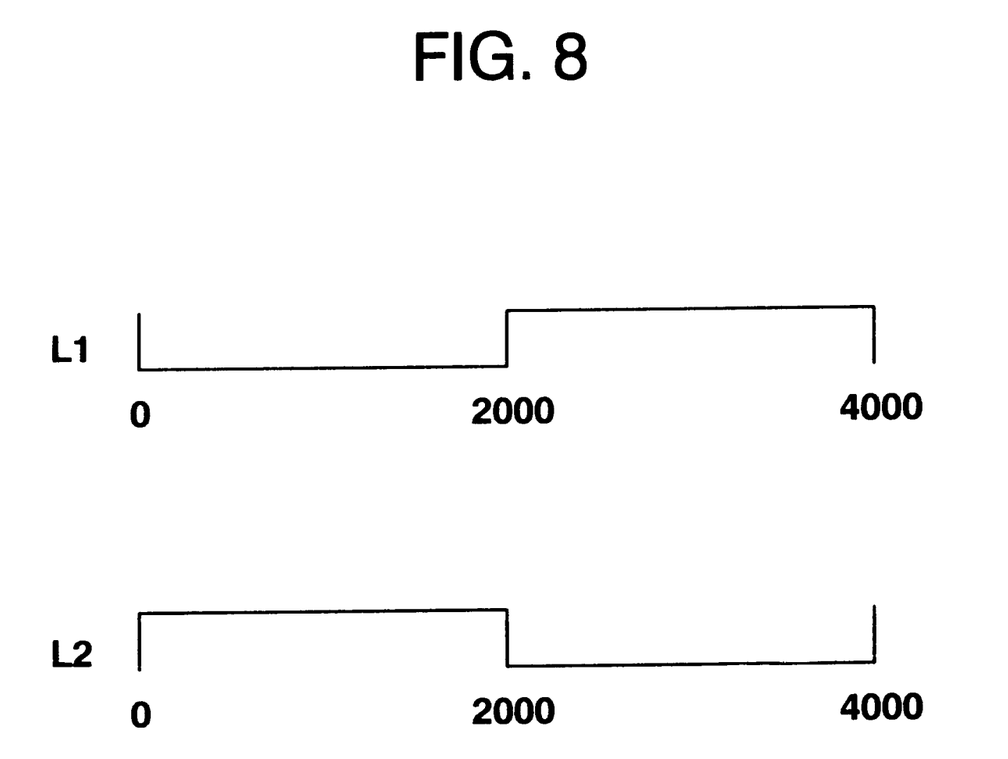
FIG. 8 illustrates, in timing diagram form, a plurality of clock signals which correspond to a phase reference table.

The clocks associated with one embodiment of the present invention are illustrated in FIG. 8.

The phase table of Table 1 includes the set of tags used to label the phases of signal transitions. The phase table is used to relate those tags to a type of a signal (clock, static data, etc.) and an idealized "base time" for the signal switching event. The base time of an event can be interpreted as the time that the event would occur if all delays in the circuit being evaluated were zero. Base times are specified in a global frame of reference. Since the clock circuit is assumed to be controlled by periodic signals, a period for each phase is also stored in the phase table with its associated phase tag. Creation and use of such phase tables is described in greater detail in U.S. Pat. No. 5,210,700 by David Tom, assigned to International Business Machines Corporation, and filed on May 11, 1993, which is incorporated by reference herein.

Once the phase table has been constructed in block 618, data processing system 600 assigns the primary input arrival time (AT) assertions in block 620. Each arrival time assertion specifies both an actual signal event time and the phase associated with that event. Subsequently, data processing system 600 propagates the phases through a model of the circuit to label each point in the circuit as carrying either clock or data signals. This propagation is guided by a set of rules, such as those listed below:

If a subcircuit has only data inputs, then its output is a data signal.

If a subcircuit has clock inputs and is a latch, then its output is a data signal.

If a subcircuit has clock inputs and is a dynamic logic gate, then its output is a data signal.

If a subcircuit has clock inputs and is a static gate, then its output is a data signal.

Additional rules may exist, and if necessary, users can provide manual overrides to the normal labelling.

It should be noted that this set of rules is one embodiment which may be implemented and other embodiments may also be used in the present embodiment of the invention.

Afterwards, in block 624, data processing system 600 computes delays and arrival times for all points in the circuit starting from the times given in the user-specified arrival time assertions. This results in all points in the timing model having valid signal times and associated phase tags. This step will subsequently be described in greater detail.

In block 626, data processing system 600 computes required times and slacks. It should be noted that slacks are the differences between a signal event's required time and its actual arrival time. In establishing the selection of a test edge for each data test point, data processing system 600 extracts the necessary data records for the test from required time assertions and timing constraints that are generated upon recognition of specific circuit structures. For the test point, data processing system 600 extracts the reference point and reference signal level. Furthermore, data processing system 600 then obtains the test signal levels to be tested against the reference signal level. For the reference point and reference signal level, the system extracts a phase record index from the timing delay record. From the phase table, data processing system 600 extracts the phase time for the reference edge. For the test point and test signal, data processing system 600 extracts the test signal time and phase record index from the test point. Next, from the phase table, data processing system 600 extracts the phase time for the test edge. Finally, data processing system determines an amount of time required to adjust the reference signal to account for the periodicity of the controlling clock signals.

To implement step 624 of the flow chart of FIG. 6, the present invention implements a methodology which takes advantage of the fact that certain signals, such as clock signals, have predictable behavior which may be denoted in the timing model utilized to perform the static timing analysis. To indicate whether a signal has a predictable behavior, such as the periodicity exhibited by clock signals, a special designation is used to indicate which nodes of a circuit being analyzed are clock nodes. To determine whether or not a node is a clock node or a data node, heuristic and user-provided rules are selectively used in a preprocessing step.

The distinction between data and clock nodes is important because of the assumptions made about each type of node. Signals on data nodes may or may not switch in a given cycle. Conversely, signals on a clock node are expected to switch in every cycle. In the present invention, for each channel-connected component output, or node, that is labeled as a clock, a delay is calculated assuming that all clock inputs switch at the latest or earliest times, as selected, in order to obtain respectively the latest, or earliest, output signal time. When this delay calculation is performed by circuit simulation or transient analysis, the analysis will include an actual logical function of the channel-connected component including the interaction among input signals. For example, in the NOR gate of the clock shaping circuit of FIG. 2, the output rise and fall times would be computed by a single simulation for each transition, instead of pairs of simulations which assume independent inputs in a manner adopted by traditional static timing analyzers. By utilizing the rise and fall times computed in dynamic analysis, more precise knowledge of the rise and fall times of the clock signal may be provided when the methodology of the present invention is utilized.

Figure 7:
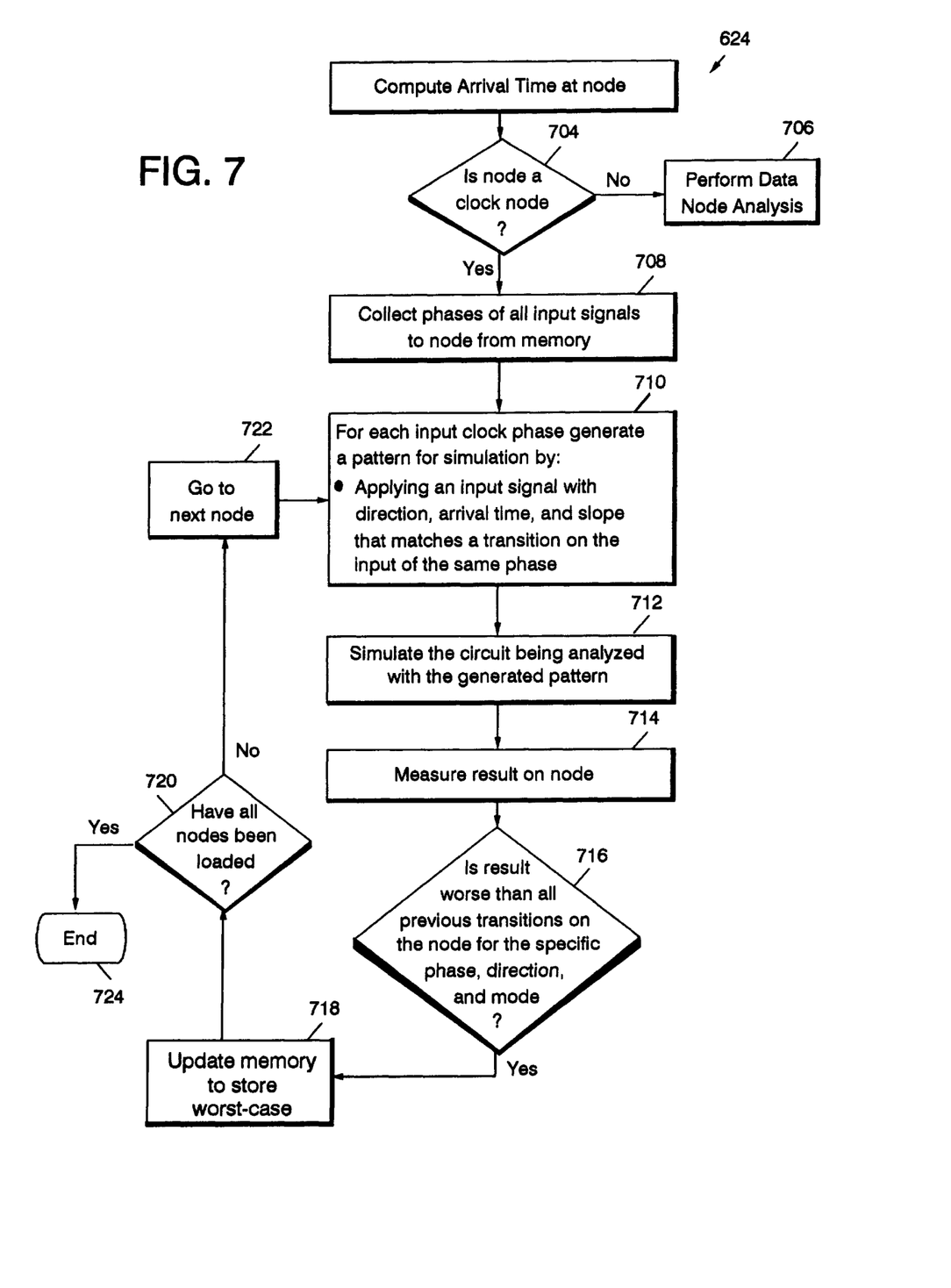
FIG. 7 illustrates, in flow diagram form, a step of computing and propagating delays in accordance with the methodology of the present invention as illustrated in FIG. 6.

Thus, to implement the methodology of the present invention, after the clock nodes are identified, a reference table is accessed to determine event times in a manner such as that previously described. Such event times include properties of the identified clock nodes in ideal situations. The properties of the identified clock nodes indicate a rise time and a fall time, as well as a frequency of the clock signal provided thereto. The reference table is included in a memory of data processing system 600 (not illustrated herein). A circuit simulator may also be used to determine event times for each gate implemented in the circuit being simulated. In this case, correct input patterns must be provided to the circuit simulator. By utilizing the recognition that clock signals are periodic in nature, a number of input patterns required to test each logic gate is reduced and a correct result may be efficiently calculated using circuit simulation procedures. In the above implementation, the steps of the flow chart illustrated FIG. 7 are executed. Each of those steps will subsequently be described in greater detail.

To compute the arrival time at a node of a circuit being simulated, it must first be determined in step 704 whether the node is a clock node or a data node. If the node is a data node, a data node analysis is performed in step 706. Performance of this analysis will rot be described in detail herein. However, it should be noted that this analysis is done primarily in a pattern-independent way that assumes that data signals can have arbitrary values and computes delays assuming worst-case assignments to these data signals. The analysis for a clock node computes one latest (and possibly also one earliest) transition for each clock phase associated with the node. To do this, the phases of all input signals to the node are collected from memory in a step 708. As previously mentioned, the memory which stores such phases is included in data processing system 600, but not illustrated herein.

Next, in step 710, a pattern for simulation is generated for each input clock phase. This step is performed by applying an input signal with a direction, arrival time, and slope which matches a transition on the input of the same phase. Each clock input is stimulated with an input signal having a direction (rising or falling), arrival time, and transition time which matches a transition on the corresponding input having the matching phase. Any data inputs are set to constant noncontrolling values (a noncontrolling value is a value of an input signal which does not force an output to have a constant value).

After a first pattern has been generated for a first input clock phase, the circuit being analyzed is simulated with a generated pattern in a step 712. A result is subsequently measured on the node being tested in step 714. The result indicates a delay associated with the provision of the input to the node and an output generated by the circuit under test. If the result measured in step 714 is worse than all previous transitions on the node for the specific phase, direction, and mode (early or late), a memory location which corresponds to a delay associated with the present circuit being tested is updated with the new pattern. Each of steps 710 through 716 is repeated for all nodes included in a circuit being analyzed. If all the nodes have been tested, a delay associated with the circuit being simulated has been determined and step 624 of the general flow illustrated in FIG. 6 has been completed. Subsequently, a next circuit is analyzed using this procedure.

Figure 9:
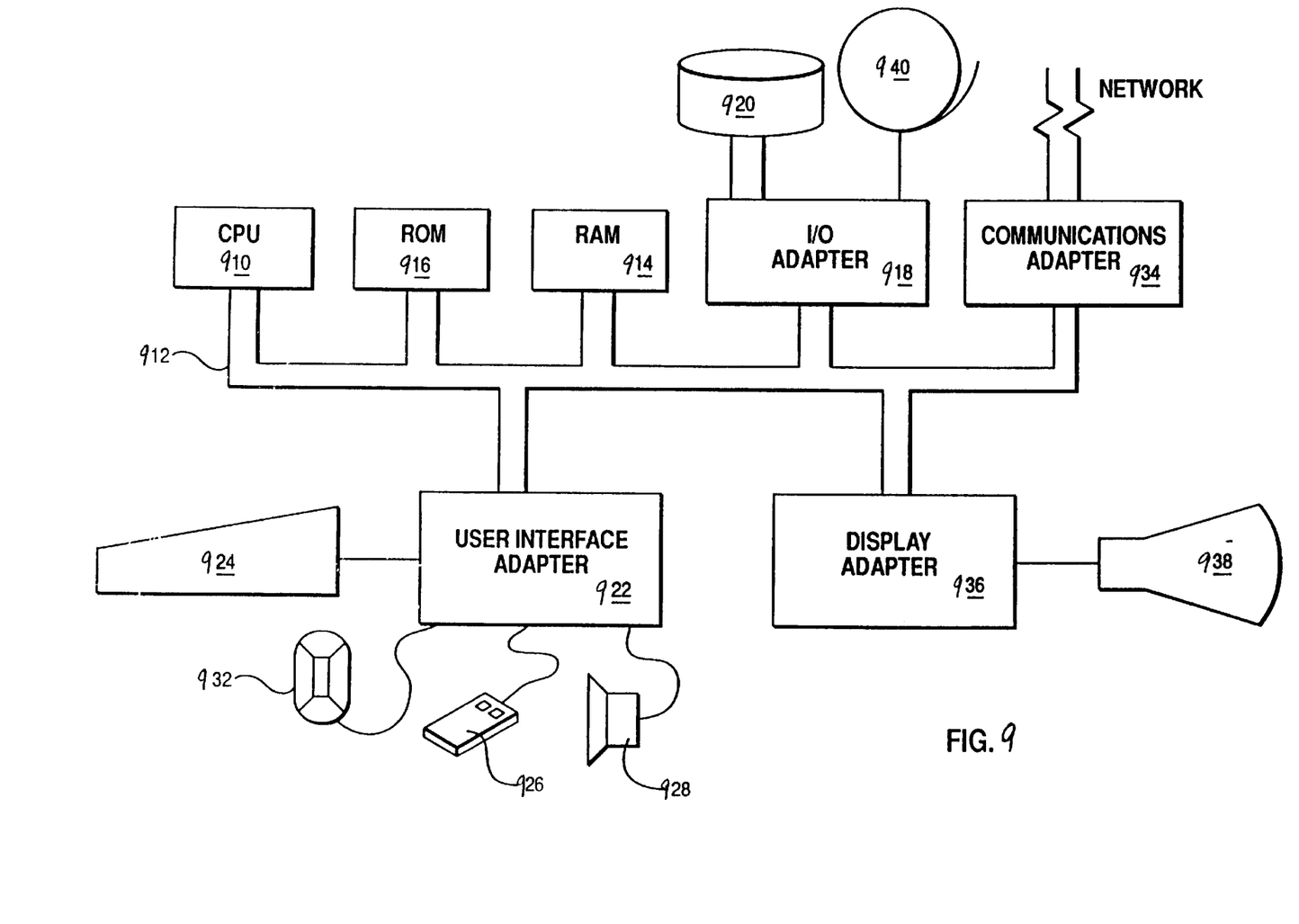
FIG. 9 illustrates, in block diagram form, an embodiment of a data processing system for implementing the present invention.

It should be noted that the present invention may be implemented as a computer program and executed on a data processing system such as that illustrated in FIG. 9. While FIG. 5 provides a basic system for implementing the present invention, FIG. 9 provides an alternate embodiment.

Referring first to FIG. 9, an example is shown of a data processing system 900 which may be used for the invention. The system has a central processing unit (CPU) 910, such as a Power PC microprocessor ("PowerPC" is a trademark of IBM Corporation) according to "The PowerPC Architecture: A Specification for a New Family of RISC Processors", 2nd edition, 1994, Cathy May, et al. Ed., which is hereby incorporated herein by reference. A more specific implementation of a PowerPC microprocessor is described in the "PowerPC 604 RISC Microprocessor User's Manual", 1994, IBM Corporation, which hereby incorporated herein by reference. The history buffer (not shown) of the present invention is included in CPU 910. The CPU 910 is coupled to various other components by system bus 912. Read only memory ("ROM") 916 is coupled to the system bus 912 and includes a basic input/output system ("BIOS") that controls certain basic functions of the data processing system 900. Random access memory ("RAM") 914, I/O adapter 918, and communications adapter 934 are also coupled to the system bus 912. I/O adapter 918 may be a small computer system interface ("SCSI") adapter that communicates with a disk storage device 920. Communications adapter 934 interconnects bus 912 with an outside network enabling the data processing system to communication with other such systems. Input/Output devices are also connected to system bus 912 via user interface adapter 922 and display adapter 936. Keyboard 924, track ball 932, mouse 926 and speaker 928 are all interconnected to bus 912 via user interface adapter 922. Display monitor 938 is connected to system bus 912 by display adapter 936. In this manner, a user is capable of inputting to the system throughout the keyboard 924, trackball 932 or mouse 926 and receiving output from the system via speaker 928 and display 938. Additionally, an operating system such as AIX ("AIX" is a trademark of the IBM Corporation) is used to coordinate the functions of the various components shown in FIG. 9.

Preferred implementations of the invention include implementations as a computer system programmed to execute the method or methods described previously herein, and as a computer program product. According to the computer system implementation, sets of instructions for executing the method or methods are resident in the random access memory 914 of one or more computer systems configured generally as described above. Until required by the computer system, the set of instructions may be stored as a computer program product in another computer memory, for example, in disk drive 920 (which may include a removable memory such as an optical disk or floppy disk for eventual use in the disk drive 920). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The changes may be electrical, magnetic, chemical or some other physical change. While it is convenient to describe the invention in terms of instructions, symbols, characters, or the like, the reader should remember that all of these and similar terms should be associated with the appropriate physical elements.

Note that the invention describes terms such as comparing, validating, selecting or other terms that could be associated with a human operator. However, for at least a number of the operations described herein which form part of the present invention, no action by a human operator is desirable. The operations described are, in large part, machine operations processing electrical signals to generate other electrical signals.

The implementation of the invention described herein is provided by way of example only. However, many other implementations may exist for executing the function described herein. Furthermore, while there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention. Additionally, it is to be noted that although the present invention and its advantages have been described in detail, it should be understood that various changes, substitutions, and alterations can be made herein without departing from the spirit and scope of the invention as defined by the appended claims.

What is claimed is:

1. A method for performing a timing analysis of a clock circuit, comprising the steps of:
   receiving a plurality of input signals at a node of the clock circuit;
   determining a phase corresponding to a first one of the plurality of input signals of the node; and
   generating a simulation pattern which enables an output of the node to transition from a first logic state to a second logic state by applying a generated signal which has the phase corresponding to the first one of the plurality of input signals of the node.

2. The method of claim 1 further comprising the step of:
   simulating a function of the clock circuit by providing the simulation pattern to an input of the clock circuit.

3. The method of claim 2, further comprising the step of:
   measuring a result of the simulation pattern on the node of the clock circuit.

4. The method of claim 3 wherein the result indicates a delay associated with the provision of the first one of the plurality of input signals and an output generated by the clock circuit.

5. The method of claim 3, further comprising the steps of:
   determining whether the result is less than a previous result of a previous simulation pattern on the node of the clock circuit;
   storing the previous result of the previous simulation pattern in a memory when the previous result is greater than the result; and
   storing the result of the simulation pattern in the memory when the previous result is less than the result.

6. The method of claim 3, further comprising the steps of:
   determining whether the result is less than a previous result of a previous simulation pattern on the node of the clock circuit;
   storing the previous result of the previous simulation pattern in a memory when the previous result is less than the result; and
   storing the result of the simulation pattern in the memory when the previous result is greater than the result.

7. The method of claim 1 wherein the clock circuit is a clock shaping circuit.

8. A method for performing static timing analysis of a circuit, comprising the steps of:
   generating a timer model from the circuit;
   generating a phase table using the timer model;
   determining a plurality of arrival time assertions using the phase table and the timer model, wherein the plurality of arrival time assertions indicate a plurality of actual signal event times and a plurality of phases associated with an event;
   propagating the plurality of phases through the model of the circuit to identify each of a plurality of nodes of the circuit as one of a clock node and a data node; and
   computing a delay and an arrival time for each of the plurality of nodes in the circuit, wherein the step of computing comprises the steps of:
   receiving a plurality of input signals of a first one of the plurality of nodes;
   determining a phase corresponding to a first one of the plurality of input signals of the first one of the plurality of nodes; and
   generating a simulation pattern which enables an output of the first one of the plurality of nodes to transition from a first logic state to a second logic state by applying a generated signal which has the phase corresponding to the first one of the plurality of input signals of the first one of the plurality of nodes.

9. The method of claim 8, further comprising the step of:
   simulating a function of the circuit by providing the simulation pattern to an input of the circuit.

10. The method of claim 9, further comprising the step of:
    measuring a result of the simulation pattern on the first one of the plurality of nodes of the circuit.

11. The method of claim 10, further comprising the steps of:
    determining whether the result is greater than a previous result of a previous simulation pattern on the first one of the plurality of nodes of the circuit;
    storing the previous result of the previous simulation pattern in a memory when the previous result is greater than the result; and
    storing the result of the simulation pattern in the memory when the previous result is less than the result.

12. The method of claim 11 wherein the result indicates a delay associated with the provision of the first one of the plurality of input signals and an output generated by the circuit.

13. The method of claim 10, further comprising the steps of:
- determining whether the result is less than a previous result of a previous simulation pattern on the first one of the plurality of nodes of the circuit;
- storing the previous result of the previous simulation pattern in a memory when the previous result is less than the result; and
- storing the result of the simulation pattern in the memory when the previous result is greater than the result.

14. The method of claim 8 wherein the phase indicates a rise time of the first one of the plurality of input signals.

15. The method of claim 8 wherein the phase indicates a fall time of the first one of the plurality of input signals.

16. The method of claim 8 wherein the phase indicates a frequency of the first one of the plurality of input signals.

17. The method of claim 8 wherein the first one of the plurality of input signals is a clock signal.

18. The method of claim 8 wherein the circuit is a clock shaping circuit.

19. The method of claim 8 wherein the phase table defines a clock signal used in the timer model.

20. The method of claim 8 wherein the event is an actual signal event.

21. The method of claim 8 wherein the plurality of arrival time assertions are determined with a plurality of base times accessed from the phase table.

22. A data processing system, comprising:
- a memory for storing a model of a clock circuit; and
- a data processor for computing a delay between a first signal being provided to a node of the clock circuit and a second signal being output by the node of the clock circuit in response to the first signal, the data processor computing the delay by determining a phase corresponding to the first signal and applying a generated signal which has the phase corresponding to the first signal to the node.

23. The data processing system of claim 22 wherein the clock circuit is a clock shaping circuit.

24. A program storage device readable by a machine, tangibly embodying a program of instructions executable by the machine to perform method steps for performing a timing analysis of a clock circuit, said method steps comprising:
- receiving a plurality of input signals at a node of the clock circuit;
- determining a phase corresponding to a first one of the plurality of input signals of the node; and
- generating a simulation pattern which enables an output of the node to transition from a first logic state to a second logic state by applying a generated signal which has the phase corresponding to the first one of the plurality of input signals of the node.

25. The program storage device of claim 24 embodying the program of instructions executable by the machine to perform method steps, said method steps further comprising a step of:
- simulating a function of the clock circuit by providing the simulation pattern to an input of the clock circuit, wherein the result indicates a delay associated with the provision of the first one of the plurality of input signals and an output generated by the clock circuit.

26. The program storage device of claim 25 embodying the program of instructions executable by the machine to perform method steps, said method steps further comprising the steps of:
- determining whether the result is less than a previous result of a previous simulation pattern on the node of the clock circuit;
- storing the previous result of the previous simulation pattern in a memory when the previous result is greater than the result; and
- storing the result of the simulation pattern in the memory when the previous result is less than the result.

27. The program storage device of claim 25 embodying the program of instructions executable by the machine to perform method steps, said method steps further comprising the steps of:
- determining whether the result is less than a previous result of a previous simulation pattern on the node of the clock circuit;
- storing the previous result of the previous simulation pattern in a memory when the previous result is less than the result; and
- storing the result of the simulation pattern in the memory when the previous result is greater than the result.

* * * * *